United States Patent [19]

Hale et al.

[11] Patent Number: 4,649,084

[45] Date of Patent: Mar. 10, 1987

[54] PROCESS FOR ADHERING AN OXIDE COATING ON A COBALT-ENRICHED ZONE, AND ARTICLES MADE FROM SAID PROCESS

[75] Inventors: Thomas E. Hale, Warren; Warren C. Yohe, Mt. Clemens, both of Mich.

[73] Assignee: General Electric Company, Detroit, Mich.

[21] Appl. No.: 730,511

[22] Filed: May 6, 1985

[51] Int. Cl.$^4$ .............................................. B22F 3/00
[52] U.S. Cl. ...................................... 428/552; 75/236; 75/238; 75/240; 75/242; 419/15; 419/16; 419/38; 419/53; 419/54; 419/57; 427/314; 428/565; 428/652; 428/698; 428/908.8; 428/699
[58] Field of Search .................... 419/15, 16, 26, 38, 419/53, 54, 57; 75/236, 238, 240, 242; 428/552, 565, 652, 698, 908.8, 699; 427/314

[56] References Cited

U.S. PATENT DOCUMENTS

| | | | |
|---|---|---|---|
| Re. 32,111 | 4/1986 | Lambert et al. | 428/699 |
| 3,736,107 | 5/1973 | Hale | 29/182.7 |
| 3,971,656 | 7/1976 | Rudy | 75/203 |
| 4,018,631 | 4/1977 | Hale | 148/31.5 |
| 4,049,876 | 9/1977 | Yamamato et al. | 428/932 |
| 4,063,938 | 12/1977 | Weissman | 75/205 |
| 4,150,195 | 4/1979 | Tobioka et al. | 428/548 |
| 4,239,536 | 12/1980 | Yamamato et al. | 75/238 |
| 4,276,096 | 6/1981 | Kolaska et al. | 148/16.6 |
| 4,277,283 | 7/1981 | Tobioka et al. | 75/238 |
| 4,300,952 | 11/1981 | Ingelstrom et al. | 75/238 |
| 4,320,203 | 3/1982 | Brandt et al. | 501/87 |
| 4,350,528 | 9/1982 | Engle | 75/203 |
| 4,357,382 | 11/1982 | Lambert et al. | 428/698 |
| 4,374,685 | 2/1983 | Suzuki et al. | 148/126 |
| 4,497,874 | 2/1985 | Hale | 75/238 |
| 4,501,786 | 2/1985 | Hale | 428/215 |
| 4,548,786 | 10/1985 | Yohe | 419/29 |
| 4,556,607 | 12/1985 | Sastri | 428/627 |

FOREIGN PATENT DOCUMENTS

| | | |
|---|---|---|
| 3039775 | 10/1980 | Fed. Rep. of Germany . |
| 60-36635 | 4/1984 | Japan . |
| 2061324 | 5/1981 | United Kingdom . |
| 2095702A | 2/1982 | United Kingdom . |

OTHER PUBLICATIONS (K. Hayashi), *Hard Phase Formulation on the Surface of WC-β-Co Alloys by Diffusion Method*, Journal of Jap. Soc. and Powder Metallurgy, vol. 29, No. 5, Jul. 1982.

(H. Suzuki), *The β-free Layer Formed Near the Surface of Vacuum-Sintered WC-β-Co Alloys Containing Nitrogen*, Transactions of the Japan Institute of Metals, vol. 22, No. 11, (1981), pp. 758 to 764.

*Cutting Tool Materials*, Proceedings of an International Conference organized under Mr. Frank Gorsler of General Electric, Sep. 15, 1980.

*Preparation and Machining Properties of CVD Al$_2$O$_3$ Coated Cemented Carbide Tools With Various Intermediate Layers*, J. Lindstrom et al.; Proc. Ninth International Conference, (1984) on Chemical Vapor Deposition, Robinson et al., Ed., Electrochemical Society.

*Verschleiss–Schutzschichten Auf Hartmetallen*, O. Rudiger et al.; Wear, vol. 48, No. 1, pp. 267–282, May 1978.

*Primary Examiner*—Stephen J. Lechert, Jr.
*Attorney, Agent, or Firm*—A. E. Bahr; E. F. Chapman

[57] ABSTRACT

An improved fabrication process for cobalt-enriched cemented carbide substrates is disclosed, in which an article is generally comprised of tungsten carbide, cobalt, and carbides, nitrides or carbonitrides of titanium, tantalum, and niobium, or mixtures thereof. In one aspect of the invention the article is contacted with nitrogen gas and then sintered in the absence of nitrogen gas to form a cobalt-enriched, B-1 phase-depleted zone. The article is then sintered in nitrogen gas to form a B-1 phase enriched layer on the surface of the article. Additionally, a metal oxide wear layer can be provided on the article.

43 Claims, 5 Drawing Figures

PROCESS FOR ADHERING AN OXIDE COATING ON A COBALT-ENRICHED ZONE, AND ARTICLES MADE FROM SAID PROCESS

BACKGROUND OF THE INVENTION

This invention relates to coated cemented carbide articles and the method of making such articles. More particularly, it relates to coated cemented carbide articles in which the cemented carbide substrates are modified to improve the bonding of oxide wear layers thereto.

The use of coated cemented carbides for cutting tools is well-known. The prior art coated cemented carbides generally offer a combination of high wear-resistance, mechanical strength and hardness. However, tool material failure sometimes occurs in rigorous applications, such as earth drilling and high speed metal cutting. For instance, although a coating, such as aluminum oxide ($Al_2O_3$), increases the wear resistance of tools, inadequate adherence of the coating to the underlying carbide substrate tends to nullify the effect of that improvement, especially in high-speed cutting applications.

Another factor contributing to the failure of coated cemented carbide tools is that increased wear resistance from coatings of titanium carbide (TiC) and aluminum oxide ($Al_2O_3$) results in a decrease in the strength of the substrate. Breakage or chipping of the cutting tool accompanies this reduced substrate strength, and tool performance is thus adversely affected. Furthermore, the need for frequent replacement of worn or chipped tools results in higher overall machining costs and lower machine shop productivity.

In U.S. Pat. No. 4,018,631, improved adherence of oxide coatings on cemented carbide substrates containing tungsten and cobalt is attained by forming on the substrate a coating selected from carbides, nitrides, carbonitrides and mixtures thereof, diffusing tungsten and cobalt from the substrate into the coating, oxidizing the coating and then coating the oxidized coating with an oxide wear layer. Although this technique improves adherence of oxide coatings to cemented carbide substrates, and good wear resistance is realized in articles formed by the process of U.S. Pat. No. 4,018,631, it is desirable to further improve the wear resistance of such articles and to improve the adherence of oxide coatings on cemented carbide substrates.

In U.S. Pat. No. 4,277,283, there is disclosed a method for producing a sintered hard metal. The method generally involves the compacting of mixtures of carbides and nitrides of Group IVa, Va and VIa metallic elements, as well as a tungsten carbide phase, into a predetermined shape, and then sintering the pressed mixture in a vacuum at high temperatures. Although it is disclosed in U.S. Pat. No. 4,277,283 that this technique slightly improves the wear resistance of the resulting article, still further enhancement of wear resistance for these types of metals is desirable.

The most effective prior art processes generally involve three steps. For instance, in U.S. Pat. No. 4,018,631, the steps comprise: treating the insert in a chemical vapor deposition (CVD) atmosphere to form carbides, nitrides and carbonitrides of metals, such as titanium and tantalum; firing the insert in a non-reactive atmosphere to diffuse tungsten and cobalt into the CVD-formed coating; and heating the insert in an oxidizing atmosphere to oxidize the coating. Since these three steps require four separate furnace cycles, processing and handling time requirements can result in high production costs.

It is therefore an object of this invention to provide a process to improve the adherence of oxide wear coatings to an underlying tungsten carbide substrate.

It is a further object of this invention to provide a process for increasing the strength of carbide substrates so as to reduce breaking or chipping of cutting tools having wear resistant coatings thereon.

It is still a further object of this invention to provide an improved process for pretreating and oxidizing a cutting tool substrate which requires a smaller number of furnace cycles than in prior art processes.

It is yet another object of this invention to provide an improved process for pretreating and oxidizing a cutting tool substrate which is not subject to the above-mentioned problems and disadvantages.

SUMMARY OF THE INVENTION

The foregoing objects are achieved by an improved fabrication process for cobalt-enriched cemented carbide substrates and the application of an overlayer of a metal oxide to said substrate. In general, a metal oxide wear layer is deposited on a modified tungsten carbide alloy substrate. The tungsten carbide substrate of the present invention contains cobalt and at least one carbide, nitride or carbonitride of titanium, and at least one carbide, nitride or carbonitride of a group comprising tantalum and niobium, or mixtures thereof.

In one aspect of the present invention, there is provided a method of improving the adherence of metal oxide coatings on tungsten carbide substrates. In the process of adhering the metal oxide coating on the tungsten carbide substrate, an article having the alloy composition described above is sintered at a temperature at or above the melting point of the cobalt phase for a period of time sufficient to cause the formation of a B-1 phase enriched layer on the surface of the article. The surface of the article is then oxidized and an oxide wear layer is deposited on the oxidized surface.

In another aspect of the present invention, the alloy composition described above is first contacted with nitrogen gas at a temperature below the melting point of the cobalt phase of the alloy composition for a time period sufficient to diffuse nitrogen gas into the article. After the nitrogen gas has diffused into the article, the temperature of the article is increased to at least the melting point of the cobalt phase, after which the article is sintered in the absence of nitrogen gas for a period of time sufficient to form a cobalt-enriched, B-1 phase-depleted zone. The article is then sintered in nitrogen gas at a temperature at or above the melting point of the cobalt phase for a period of time sufficient to cause the formation of a B-1 phase enriched layer on the surface of the sintered article. In accordance with the present invention the article prepared above and having the B-1 phase enriched layer on the surface and a cobalt-enriched, B-1 phase-depleted zone adjacent the B-1 phase enriched surface layer can be used as a cutting tool and has sufficient strength and wear resistance to be used in many high-speed cutting applications. However, it can also be further improved by coating it with a metal oxide wear layer, and it is still a further aspect of the invention to provide a wear layer on the surface of the article having the B-1 phase enriched layer on the surface and a cobalt-enriched, B-1 phase-depleted zone adjacent the B-1 phase by oxidizing the surface of the B-1 phase enriched layer and then depositing a metal oxide layer thereon.

By the process of the present invention it has been found that adherence of oxide wear layers to modified cemented carbide substrates has been substantially improved. Furthermore, by the process of the present invention, breakage or chipping of the cutting tool having a metal wear layer coated thereon has been reduced. This has resulted in an increase in the service life of cutting tools made by the process of the present invention, which in turn has resulted in lower overall machining costs.

As used herein, the modified cemented tungsten carbide substrate is a substrate prepared by the process of the present invention and has a cobalt-enriched zone in a tungsten carbide-based article containing cobalt and at least one carbide, nitride or carbonitride of titanium and mixtures thereof and at least one carbide, nitride or carbonitride of tantalum or niobium and mixtures thereof. In one aspect of the process of the present invention, the modified cemented tungsten carbide substrate has a B-1 enriched surface layer, and in another aspect of the present invention, the modified cemented tungsten carbide substrate has a B-1 phase-depleted zone below the surface of the substrate and a B-1 phase enriched layer on the surface of the substrate. The B-1 phase-depleted zone may also be referred to as the "B-1 depleted zone" and/or the "cobalt-enriched zone."

DETAILED DESCRIPTION OF THE INVENTION

Although cemented carbide systems may comprise a large number of various alloying elements, the preferred compositions of the present invention are cobalt-containing, tungsten carbide-based compositions which also contain carbides, nitrides or carbonitrides of titanium (Ti) and mixtures thereof and carbides, nitrides or carbonitrides of either tantalum (Ta) and/or niobium (Nb) and mixtures thereof. The tungsten is the carbide former in the process and articles of the present invention, and the carbide is cemented or bonded together by the matrix metal, cobalt. Although it is not critical in the practice of the present invention, the matrix can also include iron or nickel or both of these metals, as well as the transition metal carbides, nitrides and/or carbonitrides discussed above.

Cutting tools, also referred to herein as inserts, are prepared by pressing powders comprised of the desired alloy composition into compact form by well-known mechanical compacting techniques, as described, for instance, in U.S. Pat. No. 3,971,656. The specific compacting conditions may vary, and are not critical in the practice of the present invention. Typical compacting pressures generally range from about 15 tons per square inch to about 20 tons per square inch.

A typical alloy composition suitable for the present invention contains, for example, from about 70% to about 90% by weight tungsten carbide, and about 5% to about 15% by weight cobalt. The balance of the alloy composition must contain at least 1% by weight of a carbide, nitride or carbonitride of Ti, such as TiC, and at least 1% by weight of a carbide, nitride or carbonitride of either Ta and/or Nb or mixtures thereof. The maximum alloy levels possible are about 20% by weight of the carbide, nitride or carbonitride of Ti, and about 30% by weight of the total carbides, nitrides and carbonitrides of Ta and Nb. It is preferable to include at least 2% by weight of TiC and at least about 1% by weight of either TaC or NbC in the alloy compositions of the present invention. These carbides help to insure good B-1 phase formation in the cemented tungsten carbide substrate. The B-1 phase is a well-known term in the art and is a hard solid solution of carbides generally having a face-centered cubic crystal lattice structure. In accordance with the present invention, hafnium (Hf) and/or Zirconium (Zr) may also be used as part of the alloy composition in conjunction with titanium.

Although most of the carbon in the composition of the article originates in the carbides or carbonitrides of the above-mentioned metals, small variations of from about 0.05% total weight to about 0.15% total weight may be made in the total carbon level. The variations can be effected by the addition of free carbon or by an additional presinter treatment in hydrogen and/or methane gas at about 700° C.–800° C. The variations are not critical in the method and article of the present invention and only affect the degree of coverage by the B-1 enriched phase on the insert surface.

The article, that is the insert, which has previously been pressed by the mechanical compacting methods mentioned above, and which has the composition discussed above, is placed in a sintering furnace. Any conventional sintering furnace capable of sustained temperatures up to about 1500° C. or higher is suitable for this process. The first step is optional and involves presintering the insert in a vacuum under conditions which will remove paraffin wax and any other lubricants used in the powder pressing operation. The presinter could instead be carried out in the presence of hydrogen ($H_2$) gas or in the presence of an inert medium like argon (Ar) gas. Temperature and time parameters for this step are not critical and are well known in the art. For example, see U.S. Pat. No. 3,971,656 for a description of a typical presintering technique. Generally, heating the insert at temperatures of about 400° C.–600° C. for about 30–90 minutes is sufficient. In accordance with the present invention, the presintering of the insert for the removal of the processing materials from the insert surface is generally carried out in a separate operation prior to the process steps of the present invention which modify the substrate and improve the adherence of the metal oxide wear layer to the substrate. Thus, the process of the present invention can be carried out with a compacted, presintered insert having the composition discussed above.

The compacted, presintered insert having the wax, lubricants and other processing materials removed therefrom is heated at a suitable temperature below the melting point of the solid WC-Co portion of the composition which is hereinafter referred to as the "cobalt phase". Preferable temperatures for this step range from about 1100° C. to about 1295° C. At a temperature below the melting point of the cobalt phase, $N_2$ gas is injected into the furnace and contacts the insert. The nitrogen can be provided by a number of sources, such as for example, bottled nitrogen gas or bottled ammonia. Typically, the nitrogen is injected at a furnace temperature of about 1260° C. $N_2$ gas penetrates the porous insert surface, and the Ti, Ta, and/or Nb in the insert react with the nitrogen to form the corresponding nitrides. The temperature range at which the nitrides are formed preferably ranges from about 1100° C. to about 1280° C. It is within the scope of the present invention to subject the insert to temperatures lower than about 1100° C. while the nitrogen gas contacts the insert and penetrates the insert to form the nitrides in the insert. However, the lower the temperature, the longer it takes to complete the nitride reactions in the insert. During this step, it is preferable to keep the temperature below the cobalt phase melting point, which is typically about 1300° C.–1330° C., while the insert is contacted with nitrogen gas. Infiltration of $N_2$ gas into the insert is thereby assured before melting point temperatures are reached because once the melting point temperatures are reached during the subsequent sintering steps, the porosity of the insert is reduced or eliminated. $N_2$ pressure levels at this stage are not critical for effective nitrogen permeation into the insert and the concurrent nitride reaction, and the preferred nitrogen pressure is from about 1 mm to more than 1520 mm Hg pressure. Typically, pressures in the range of about 400 mm to about 800 mm are used. Higher nitrogen pressure results in a faster rate of reaction of the nitrogen gas with the titanium, tantalum and/or niobium. Nitrogen exposure time during this cycle is also not critical, since shorter exposure times can be compensated for by increased temperature and/or increased pressure. Generally, the nitrogen exposure time during this step is about 30 minutes to about 60 minutes and can be easily selected for the particular temperature/ pressure conditions and compositions without undue experimentation by one skilled in the art.

Figure 4:
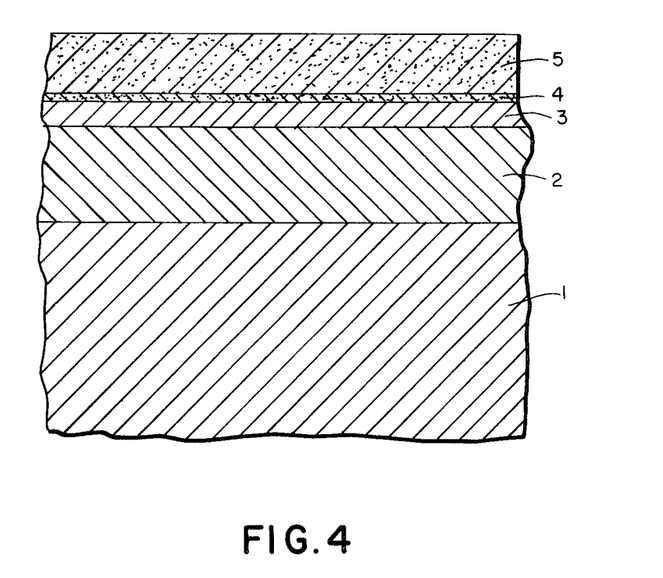
FIG. 4 is a schematic cross-sectional representation of a coated substrate of the type depicted in FIG. 3.

After the $N_2$ gas has been sufficiently diffused into the article, the temperature is increased to at least the melting point of the cobalt phase, that is, the eutectic temperature. The sintering furnace is then purged of remaining $N_2$ gas, and the $N_2$ gas is replaced by a vacuum condition and optionally by a suitably inert medium, such as argon (Ar) or helium (He) and the like. Argon is the preferred inert medium. The inert gases are injected at very low pressures, for example, in the range of about 1.0 mm to about 10.0 mm of Hg. The insert is then sintered at or above the eutectic temperature, and a cobalt-enriched, B-1 phase-depleted zone is formed at or near the surface of the insert, designated in FIG. 4 by the numeral 2. Although I do not wish to be bound by any theory during this step, the vacuum condition or inert medium appears to promote the ongoing departure of $N_2$ from the insert surface and into the atmosphere. $N_2$ from beneath the insert surface appears to move toward the insert surface to compensate for the decreased surface concentration of $N_2$. The Ti, Ta, and/or Nb that previously were bound together in the B-1 phase with $N_2$ beneath the insert surface, then appear to begin to dissolve into the cobalt phase, thus resulting in the depletion of the B-1 phase beneath the surface. When an inert medium, such as argon, is used in this step, it appears that the medium impedes the evaporation of cobalt from the surface of the article. During this step, a zone of cobalt enrichment results as the B-1 phase dissolves. This zone, which may be, for example, about 10 to about 40 microns deep, is nearly depleted of the B-1 phase and contains a high concentration of cobalt, that is, at least about 10% by weight cobalt (as compared to an initial composition of approximately 6% by weight in a typical embodiment), the balance of the composition in this zone generally comprising tungsten carbide. The presence of this amount of cobalt in the B-1 depleted layer results in a tougher cutting surface on the finished article. The sintering time schedule may vary according to the desired depth of the zone, and increasing the time at which the insert is sintered in an inert atmosphere increases the B-1 depleted, cobalt-enriched zone depth. Preferably, a sinter hold time of about 70 minutes to about 90 minutes is used for this step, along with a temperature of at least the melting point of the cobalt phase and preferably at a temperature of about 1430° C. to about 1470° C. This schedule results in an insert having a B-1 depleted, cobalt-enriched zone approximately 26 microns deep. However, sintering temperatures as low as about 1300° C. and greater than about 1470° C. are also effective for this step. Sinter hold times as short as about 45 minutes and as long as about 100 minutes would also be effective for cobalt enrichment. Referring to FIG. 4, the B-1 depleted, cobalt-enriched zone 2 overlies the normal cemented carbide phase 1, which contains some B-1 phase. The cobalt can be seen as the discrete white areas within the B-1 depleted zone in FIG. 2.

Figure 2:
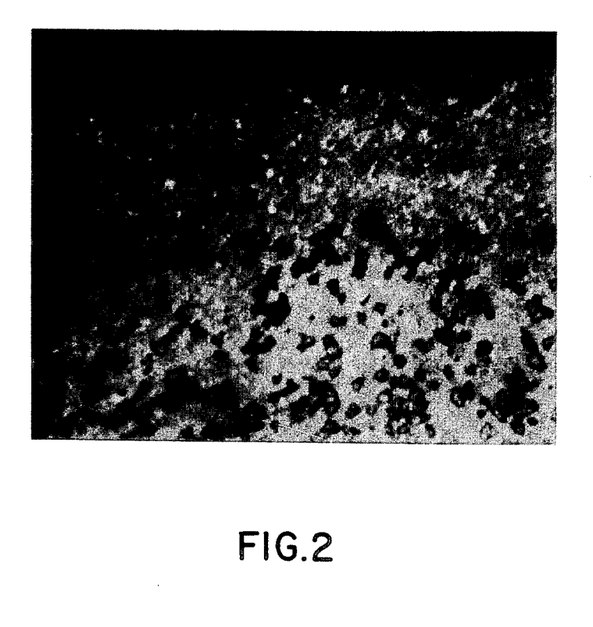
FIG. 2 is a 1500×micrograph of a typical uncoated cemented carbide substrate having both a B-1 enriched surface layer and a B-1 depleted, cobalt-enriched subsurface layer.

After the cobalt-enriched, B-1 phase-depleted zone is formed at sintering temperatures in the absence of nitrogen gas, that is, in an inert atmosphere, as discussed above, nitrogen gas is again introduced into the furnace at an elevated temperature in preparation for the formation of a B-1 phase enriched layer on the surface of the substrate adjacent the B-1 depleted zone. Temperatures for this step may range from the cobalt phase melting point (approximately 1300° C.–1330° C.) to about 1500° C., the preferred range being from about 1400° C. to about 1440° C. Nitrogen pressure levels can also be varied from about 1 mm to about 1520 mm of Hg pressure. Nitrogen pressures greater than about 1520 mm of Hg may be used, and increased nitrogen pressures generally result in an increase in the depth of the B-1 enriched layer. The preferred pressure range for this step is from about 500 mm to about 700 mm of Hg. Holding times for this sintering step in the presence of nitrogen gas may vary from about 5 minutes to about 100 minutes, with the preferred holding time being in the range of about 20 minutes to about 80 minutes. During this exposure to nitrogen, some of the B-1 forming elements, namely, Ti, Ta, and/or Nb which are dissolved in the cobalt phase, react with the nitrogen on the surface of the insert to form the corresponding nitride, that is, the B-1 nitride or carbonitride at the surface as shown in FIG. 2 and as shown by the numeral 3 in FIG. 4, designated therein as the B-1 enriched layer. The depth of this layer varies with $N_2$ pressure used in the sintering step, and is typically about 1 micron to about 5 microns deep, although the layer could be up to about 10 microns deep.

It can be seen that two of the steps that were necessary in typical prior art processes have been eliminated, that is, treating the insert in a CVD atmosphere to form carbides of the particular metals used in the composition, and then firing the insert in a non-reactive atmosphere to diffuse tungsten and cobalt into the CVD-formed coating. In the present invention, the adhesion-promoting B-1 enriched surface layer is formed during the sintering step, and additionally, a B-1 depleted subsurface layer is formed to provide improved toughness. Only two furnace cycles are necessary: one cycle for all of the above treatment steps, and a second cycle if an oxide wear layer is desired.

In those cases where it is desirable to place an oxide wear layer on the surface of the article having the B-1 enriched surface layer and the B-1 depleted subsurface layer, the surface layer of the insert is oxidized by heating the surface for about 5 to about 40 minutes at about 800° C. to about 1400° C. in an atmosphere which is oxidizing to the B-1 phase, but not oxidizing to tungsten or cobalt. Generally, lower temperatures are utilized for longer times, and higher temperatures for shorter times. A typical oxidation process is described in U.S. Pat. No. 4,018,631. Typically, the article is subjected to a hydrogen atmosphere containing about 20% by volume of carbon dioxide, and the carbides, nitrides and carbonitrides of the particular metals in the B-1 enriched surface layer become oxidized at the elevated temperature. The oxidized surface, designated by the numeral 4 in FIG. 4, is perceptible as a thin, faint line of material above the B-1 enriched layer in FIG. 3, and serves as a very receptive surface for the subsequently deposited oxide wear layer.

Figure 3:
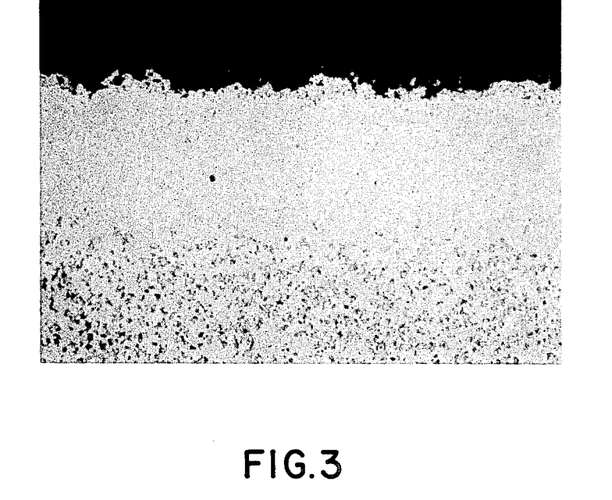
FIG. 3 is a 750×micrograph of a typical coated cemented carbide substrate of the type depicted in FIG. 2.

Finally, an oxide wear layer is deposited on the oxidized surface of the article or insert. This layer, designated by the numeral 5 in FIG. 4, imparts wear resistance to the insert. Several metal oxides are effective, for example, aluminum oxide ($Al_2O_3$) and zirconium oxide ($ZrO_2$). However, aluminum oxide is the preferred oxide because of its superior wear resistance. The metal oxide wear layer is deposited on the insert surface in the manner described and claimed in U.S. Pat. No. 3,736,107, incorporated herein by reference. In U.S. Pat. No. 3,736,107, a coating layer of aluminum oxide is deposited on a cemented carbide substrate through an intermediate layer. In the process, aluminum chloride vapor is combined with water to form aluminum oxide, which is then vapor-deposited on the intermediate layer to form a tightly adherent bond to the cemented carbide substrate through the intermediate layer. The present invention utilizes the same technique for the deposition of the metal oxide, although an intermediate layer is not included in the present invention. The metal oxide wear layer becomes tightly adherent to the insert in the present invention due to the presence of the B-1 enriched layer on the insert and due to the oxidation of the insert surface. FIG. 3 depicts a typical $Al_2O_3$-coated article having a B-1 enriched surface layer and a B-1 depleted subsurface layer. The area above the gray $Al_2O_3$ layer beginning with the irregular black border at the top of the photomicrograph is simply the backing material used in the photomicrographing process and is not a part of the invention.

Figure 1:
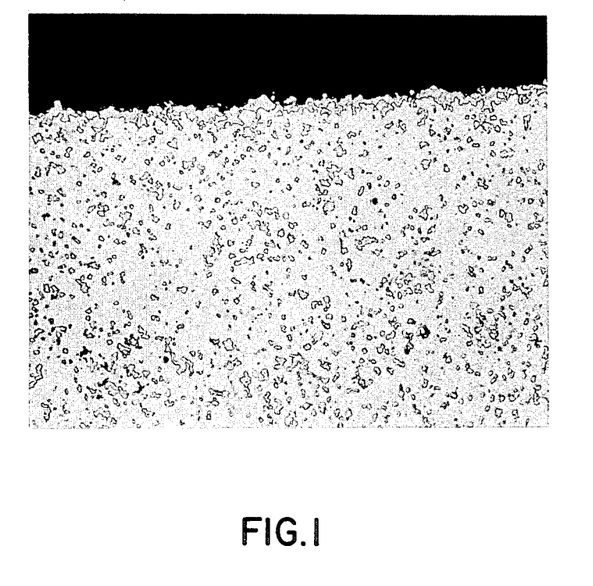
FIG. 1 is a 750×micrograph of a typical coated cemented carbide substrate having a B-1 enriched surface layer.

In an alternative embodiment, the substrate having the composition described above is pretreated so as to produce only the B-1 enriched surface layer, as typically depicted in FIG. 1. This alternative embodiment embraces a method of adhering an oxide coating on a B-1 phase enriched layer of a WC-based article which contains cobalt and at least one carbide, nitride or carbonitride of titanium, and at least one carbide, nitride or carbonitride of tantalum, niobium and/or mixtures thereof and comprises sintering the article in nitrogen gas at a temperature at or above the melting point of the cobalt phase for a period of time sufficient to cause the formation of a B-1 phase enriched layer on the surface of the sintered article; oxidizing the surface of the article; and depositing an oxide wear layer on the oxidized surface.

In this alternative embodiment, the compacted substrate is optionally presintered in vacuum as described for the embodiment discussed above. As discussed above, the temperature for the presinter of the substrate is not critical and typically can range from about 400° C. to about 600° C. In a second optional step in this alternative embodiment, the furnace temperature is raised and then the presintered insert is treated in a vacuum or in the presence of other suitable media such as hydrogen gas, argon gas and other inert gases, to eliminate contaminating gases, such as oxygen, which may be present within the insert. Temperature levels are not critical and are typically from about 1000° C. to about 1300° C., the preferred temperatures being about 1100° C.–1250° C. Holding times can vary from about 1 minute to about 120 minutes, the preferred holding time being about 30 minutes–120 minutes. The insert is then sintered for about 45 minutes to about 100 minutes in nitrogen gas at or above the melting point of the cobalt phase to form a B-1 phase enriched layer on the surface of the sintered substrate, as shown in FIG. 1. The temperature at which the substrate is heated to sinter the composition is about 1300° C. to about 1500° C., and $N_2$ pressure levels generally vary from about 1 mm to about 1520 mm of Hg pressure. Typically, the B-1 phase enriched layer is about 1 to about 5 microns thick, although in certain embodiments the layer is up to about 10 microns thick. The melting point of the cobalt phase varies according to the alloying elements in the composition and may be, for example, from about 1300° C. to about 1330° C. After the formation of the B-1 phase enriched layer, the substrate is oxidized and coated with a metal oxide wear layer as described above to produce the improved inserts useful as cutting tools in accordance with the present invention. The inserts prepared by this alternative method are suitable for less vigorous tool applications where the high breakage resistance gained with the inclusion of a B-1 depleted, cobalt-enriched zone is not required.

The following specific examples describe the novel methods and articles of the present invention. They are intended for illustrative purposes of specific embodiments only and should not be construed as a limitation upon the broadest aspects of the invention.

EXAMPLE 1

An insert was mechanically pressed from powder containing 85.5% by weight tungsten carbide (WC), 6% by weight cobalt (Co), 6% by weight tantalum carbide (TaC) and 2.5% by weight titanium carbide (TiC). The insert was then placed in a furnace, and a 45 minute presinter at 500° C. in a vacuum was followed by a 45 minute hold at 1236° C. Nitrogen gas was then injected into the furnace at 28 mm Hg and 1340° C. The temperature was steadily raised to 1432° C. and the insert was sintered at that temperature for 100 minutes. The insert was then cooled.

A B-1 phase enriched surface layer resulted with a thickness varying from about 1 micron to about 5 microns. The insert was then oxidized and coated with a layer of aluminum oxide (Al₂O₃). The adherence of the Al₂O₃ to the substrate was good. FIG. 1 depicts the type of coated insert which typically results when the process set forth in this example is carried out.

EXAMPLE 2

An insert containing 76.4% by weight WC, 10.9% by weight Co, 8.7% by weight TaC, and 4.0% by weight TiC, was first treated in a presinter operation as in Example 1. The insert was then contacted with nitrogen gas for 100 minutes at a pressure of 10 mm Hg and a temperature of 1430° C. The insert was then cooled. A B-1 enriched surface layer having a depth of about 1 micron to about 4 microns completely covered the surface. The modified surface was then oxidized and coated with Al₂O₃. The adherence of the Al₂O₃ coating to the substrate was good.

EXAMPLE 3

An insert was pressed from powder of the same composition as in Example 1, and then placed on an amorphous carbon coated shelf in a horizontal vacuum sintering furnace. The insert was then presintered at 455° C. for 45 minutes in vacuum. Nitrogen (N₂) gas was added at the end of this cycle and the temperature was raised to 1260° C. The insert was exposed to N₂ gas for 45 minutes at 600 mm of Hg pressure, and the furnace was then evacuated. Argon (Ar) gas was introduced into the furnace as the temperature was raised to 1447° C. The insert was sintered at 1447° C. in Ar gas for 80 minutes at 2 mm of Hg pressure, and Ar gas was replaced by N₂ gas at the end of this cycle. A final sinter was performed in N₂ gas for 20 minutes at 1423° C. and 600 mm Hg pressure. The insert was then removed from the furnace and quickly cooled.

The resulting B-1 phase enriched surface layer was about 1 micron to 2 microns deep. The resulting B-1 phase-depleted, cobalt enriched subsurface layer was about 26 microns deep. FIG. 2 depicts the type of uncoated insert which typically results when the process set forth in this example is carried out.

The B-1 enriched phase covered 95% of the surface. The amount of coverage depends upon the carbon level of the powder used. A carbon level of 6.15% (prior to sintering) resulted in 95% surface coverage, whereas a carbon level of 6.23% produced about 50%–90% coverage.

EXAMPLE 4

An insert of the same composition as in Example 1 was treated to a sequence of steps similar to those in Example 3, except the final sinter was carried out for 80 minutes, rather than 20 minutes.

This treatment resulted in 100% coverage by the B-1 enriched phase when the carbon level was 6.15%; 10% coverage when the carbon level was 6.15%, and only 1% coverage when the carbon level was 6.23%.

FIG. 4 is a schematic cross-sectional representation of a substrate which includes a B-1 phase-depleted, cobalt-enriched zone 2 above the typical cemented carbide zone 1 having B-1 phase material dispersed throughout. A B-1 enriched layer 3 overlies the B-1 phase-depleted layer 2, and a thin layer of oxidized B-1 phase 4 overlies the B-1 enriched layer 3. An oxide wear layer 5 is formed on the oxidized B-1 phase 4.

EXAMPLE 5

An insert of the same approximate composition as in Example 1 (with approximately a 6.10% carbon level) was presintered at 450° C. for 45 minutes in vacuum. N₂ gas was added at the end of the presinter hold, and the temperature was raised to 1261° C. The insert was exposed to N₂ gas for 45 minutes at 600 mm of Hg pressure, and the furnace was then evacuated. Ar gas was introduced as the temperature was raised to 1444° C. The insert was sintered in the Ar gas for 80 minutes at 2 mm of Hg pressure, and Ar gas was replaced by N₂ gas at the end of this cycle. A final sinter was performed in N₂ gas for 80 minutes at 1427° C. and 600 mm Hg pressure. The insert was then quickly cooled.

Figure 5:
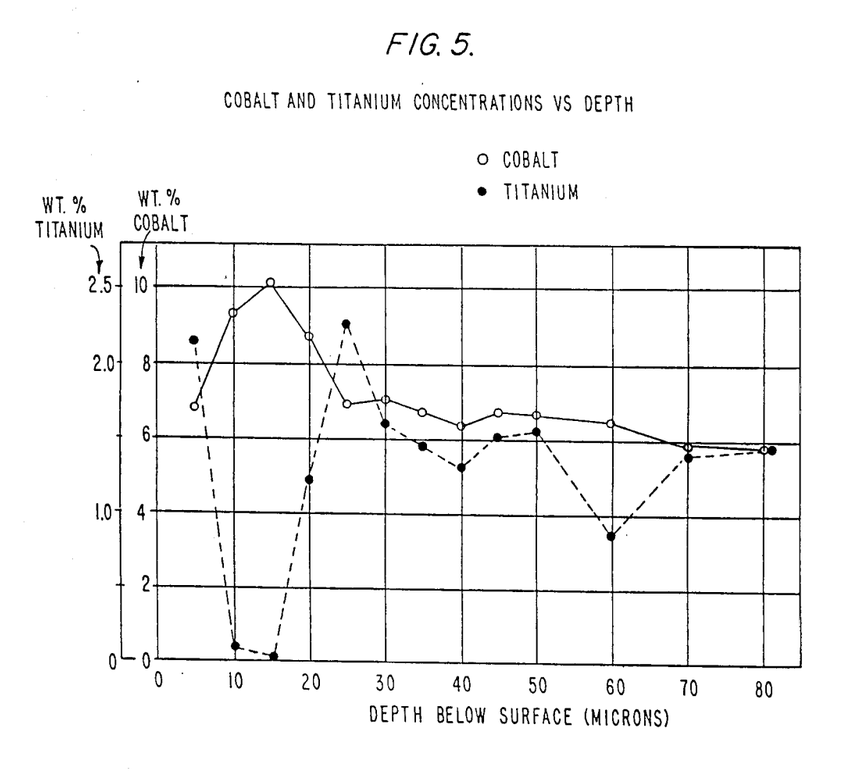
FIG. 5 is a graph depicting cobalt and titanium levels as a function of depth below the substrate surface of an unoxidized, uncoated substrate which has both a B-1 enriched surface layer and an underlying B-1 depleted, cobalt-enriched subsurface layer.

FIG. 5 illustrates levels of cobalt and titanium throughout the modified areas of an uncoated substrate having the B-1 enriched surface layer and a B-1 depleted, cobalt-enriched subsurface layer. The insert having the concentration of Co and Ti shown at the designated depths below the surface in the table below was treated according to the conditions of Example 5.

The graph of FIG. 5 was plotted from data shown in the following table:

| DEPTH (Microns) | Co Concentration (Weight %) | Ti Concentration (Weight %) |
| --- | --- | --- |
| 5 | 6.8 | 2.15 |
| 10 | 9.3 | 0.10 |
| 15 | 10.1 | 0.03 |
| 20 | 8.7 | 1.23 |
| 25 | 6.9 | 2.25 |
| 30 | 7.0 | 1.60 |
| 35 | 6.7 | 1.45 |
| 40 | 6.3 | 1.30 |
| 45 | 6.7 | 1.50 |
| 50 | 6.6 | 1.55 |
| 55 | — | — |
| 60 | 6.4 | 0.85 |
| 65 | — | — |
| 70 | 5.9 | 1.40 |
| 75 | — | — |
| 80 | 5.8 | 1.45 |

As shown in FIG. 5, relatively small concentrations of cobalt (about 6.8% by weight) were found near the surface, but the level of cobalt sharply increased 15 microns below the surface. This enrichment of cobalt below the surface improves the toughness of the substrate and was accompanied by a depletion of titanium (i.e., a part of the B-1 phase) at that same subsurface level. FIG. 5 also demonstrates that the surface layer (i.e., up to about 5 microns below the surface) contains a relatively high concentration of titanium, which is part of the B-1 phase. This B-1 enriched surface layer promotes adhesion of the subsequently deposited metal oxide layer.

While the invention has been described with respect to preferred embodiments, it will be apparent that certain modifications and changes can be made without departing from the spirit and scope of the invention and, therefore, it is intended that the foregoing disclosure be limited only by the claims appended hereto.

What is claimed is:

1. A method of improving the adherence of an oxide coating on a tungsten carbide-based substrate, the composition of which comprises tungsten carbide, cobalt and at least one carbide, nitride or carbonitride of titanium, and at least one carbide, nitride or carbonitride of tantalum, niobium or mixtures thereof, comprising the steps of:
(a) sintering the substrate in nitrogen gas at a temperature at or above the melting point of the cobalt phase for a period of time sufficient to cause the formation of a B-1 phase enriched layer on the surface of the sintered substrate;
(b) oxidizing the surface of the substrate; and
(c) depositing an oxide wear layer on the oxidized surface.

2. The method of claim 1 wherein the composition is a powder, and the powder is mechanically compacted prior to sintering the substrate in nitrogen gas.

3. The method of claim 2 wherein the compacted composition contains processing materials which promote compaction and further comprising heating the compacted composition in an atmosphere comprising hydrogen gas, a noble gas or mixtures thereof for a sufficient time to remove processing materials therefrom prior to sintering the substrate in nitrogen gas.

4. The method of claim 2 wherein the compacted composition contains processing materials which promote compaction and further comprising heating the compacted composition in a vacuum for a sufficient time to remove processing materials therefrom prior to sintering the substrate in nitrogen gas.

5. The method of claim 4 further comprising heating the compacted composition in a vacuum at a temperature of about 1000° C. to about 1300° C. for a sufficient time to remove contaminating gases therefrom prior to sintering the substrate in nitrogen gas.

6. The method of claim 4 further comprising heating the compacted composition in an atmosphere comprising hydrogen gas, a noble gas or mixtures thereof for a sufficient time to remove contaminating gases therefrom, prior to sintering the substrate in nitrogen gas.

7. The method of claim 1 wherein the substrate comprises about 70% to about 90% by weight tungsten carbide and about 5% to about 15% by weight cobalt.

8. The method of claim 1 wherein the substrate is sintered in nitrogen gas at a temperature of about 1300° C. to about 1500° C. for about 45 minutes to about 100 minutes.

9. The method of claim 8 wherein the pressure of the nitrogen gas is about 1 mm Hg to about 1,520 mm Hg.

10. The method of claim 1 wherein the surface of the substrate is oxidized by heating the surface at a temperature of about 800° C. to about 1400° C. for about 5 minutes to about 40 minutes in the presence of hydrogen gas containing carbon dioxide.

11. The method of claim 1 wherein the oxide wear layer is aluminum oxide.

12. A method of preparing a cemented tungsten carbide cutting insert the composition of which comprises tungsten carbide, cobalt, and at least one carbide, nitride or carbonitride of titanium, and at least one carbide, nitride or carbonitride of tantalum, niobium or mixtures thereof, comprising the steps of:
(a) contacting the composition in a pressed powder compacted state in the shape of a cutting insert at a temperature below the melting point of the cobalt phase with nitrogen gas for a time period sufficient to diffuse nitrogen gas into the insert;
(b) increasing the temperature of the insert to at least the melting point of the cobalt phase;
(c) sintering the insert at a temperature of at least the melting point of the cobalt phase in the absence of nitrogen gas for a period of time sufficient to form a cobalt-enriched, B-1 phase depleted zone; and
(d) sintering the insert in nitrogen gas at a temperature at or above the melting point of the cobalt phase for a period of time sufficient to cause the formation of a B-1 phase enriched layer on the surface of the sintered insert.

13. The method of claim 12 further comprising:
(e) oxidizing the surface of the insert; and
(f) depositing an oxide wear layer on the oxidized surface.

14. The method of claim 13, wherein the insert in the pressed powder state contains processing materials which promote compaction, and further comprising heating the compacted composition in a vacuum for a sufficient time to remove processing materials therefrom.

15. The method of claim 13, wherein the insert in the pressed powder state contains processing materials which promote compaction, and further comprising heating the compacted composition in an atmosphere comprising hydrogen gas, a noble gas or mixtures thereof for a sufficient time to remove processing materials therefrom.

16. The method of claim 12 wherein the insert comprises at least about 2% by weight titanium carbide and at least about 1% by weight tantalum carbide.

17. The method of claim 12 wherein the insert comprises at least about 2% by weight titanium carbide and at least about 1% by weight niobium carbide.

18. The method of claim 12 wherein the insert is sintered in step (c) in the absence of nitrogen and in the presence of argon.

19. The method of claim 12 wherein the insert is sintered in nitrogen gas in step (d) at a pressure of at least about 1 mm Hg to about 1520 mm Hg.

20. The method of claim 12 wherein the composition comprises about 70% to about 90% by weight tungsten carbide and about 5% to about 15% by weight cobalt.

21. The method of claim 12 wherein the temperature in step (a) is from about 1100° C. to about 1280° C.

22. The method of claim 12 wherein the pressure of the nitrogen gas in step (a) is from about 1 mm Hg to about 1520 mm Hg.

23. The method of claim 12 wherein the pressure of nitrogen gas in step (a) is from about 400 mm Hg to about 800 mm Hg.

24. The method of claim 18 wherein the pressure of the argon gas is about 1 mm Hg to about 10 mm Hg.

25. The method of claim 12 wherein the insert is sintered in step (c) for about 45 minutes to about 100 minutes to form the cobalt-enriched, B-1 phase depleted zone.

26. The method of claim 12 wherein the insert is sintered in step (c) for about 70 minutes to about 90 minutes to form the cobalt-enriched, B-1 phase-depleted zone.

27. The method of claim 12 wherein the insert is sintered in step (c) at a temperature from about 1300° C. to about 1470° C.

28. The method of claim 12 wherein the insert is sintered in step (c) at a temperature from about 1430° C. to about 1470° C.

29. The method of claim 12 wherein the insert is sintered in nitrogen gas in step (d) at a temperature of about 1300° C. to about 1500° C.

30. The method of claim 12 wherein the insert is sintered in nitrogen gas in step (d) at a temperature of about 1400° C. to about 1440° C.

31. The method of claim 12 wherein the insert is sintered in nitrogen gas in step (d) at a nitrogen gas pressure of about 500 mm Hg to about 700 mm Hg.

32. The method of claim 31 comprising sintering the insert in nitrogen gas for about 5 minutes to about 100 minutes.

33. The method of claim 31 comprising sintering the insert in nitrogen gas for about 20 minutes.

34. The method of claim 13 wherein the surface of the insert is oxidized by heating the surface for about 5 minutes to about 40 minutes at a temperature of about 800° C. to about 1400° C. in a hydrogen atmosphere containing carbon dioxide.

35. The method of claim 34 wherein the concentration of carbon dioxide in the hydrogen atmosphere is about 20% by volume.

36. The method of claim 13 wherein the oxide wear layer is $Al_2O_3$.

37. An article comprising:
(a) a tungsten carbide-based substrate containing cobalt and at least one carbide, nitride or carbonitride of titanium, and at least one carbide, nitride or carbonitride of tantalum, niobium or mixtures thereof;
(b) a B-1 phase-depleted, cobalt-enriched zone substantially covering the substrate; and
(c) a B-1 phase enriched zone on the surface of the B-1 phase-depleted, cobalt-enriched zone.

38. The article of claim 37 further comprising:
(d) a layer of oxidized B-1 phase on the surface of the B-1 phase enriched zone; and
(e) an oxide wear layer substantially covering the layer of oxidized B-1 phase.

39. The article of claim 37 comprising at least about 2% by weight titanium carbide and at least about 1% by weight tantalum carbide.

40. The article of claim 37 comprising at least about 2% by weight titanium carbide and at least about 1% by weight niobium carbide.

41. The article of claim 37 wherein the substrate comprises about 70% to about 90% by weight tungsten carbide.

42. The article of claim 37 wherein the substrate comprises about 5% to about 15% by weight cobalt.

43. The article of claim 38 wherein the oxide wear layer is $Al_2O_3$.

* * * * *